(12) United States Patent
Jang et al.

(10) Patent No.: US 10,752,993 B2
(45) Date of Patent: Aug. 25, 2020

(54) SUBSTRATE PROCESSING APPARATUS AND SUBSTRATE PROCESSING METHOD

(71) Applicant: WONIK IPS CO., LTD., Pyeongtaek-si, Gyeonggi-do (KR)

(72) Inventors: Wook Sang Jang, Pyeongtaek-si (KR); Sang Jun Park, Yongin-si (KR); Ho Young Lee, Daejeon (KR)

(73) Assignee: WONIK IPS CO., LTD., Pyetongtaek-si, Gyeonggi-do (KR)

( * ) Notice: Subject to any disclaimer, the term of this patent is extended or adjusted under 35 U.S.C. 154(b) by 12 days.

(21) Appl. No.: 15/785,686

(22) Filed: Oct. 17, 2017

(65) Prior Publication Data
US 2018/0105934 A1 Apr. 19, 2018

(30) Foreign Application Priority Data

Oct. 18, 2016 (KR) .......................... 10-2016-0135343

(51) Int. Cl.
| | |
|---|---|
| *H01L 21/687* | (2006.01) |
| *C23C 16/458* | (2006.01) |
| *H01L 21/677* | (2006.01) |
| *H01L 21/02* | (2006.01) |

(52) U.S. Cl.
CPC ........ *C23C 16/458* (2013.01); *C23C 16/4585* (2013.01); *H01L 21/02271* (2013.01); *H01L 21/67742* (2013.01); *H01L 21/67748* (2013.01); *H01L 21/68707* (2013.01); *H01L 21/68735* (2013.01); *H01L 21/68742* (2013.01); *H01L 21/68764* (2013.01); *H01L 21/68771* (2013.01); *H01L 21/68785* (2013.01)

(58) Field of Classification Search
CPC ...................... H01L 21/68735; C23C 16/4585
See application file for complete search history.

(56) References Cited

U.S. PATENT DOCUMENTS

| | | | | |
|---|---|---|---|---|
| 2013/0291798 A1* | 11/2013 | Lee | .................. | C23C 16/458 118/730 |
| 2016/0122872 A1* | 5/2016 | Kato | .................. | C23C 16/4409 427/8 |

FOREIGN PATENT DOCUMENTS

| | | |
|---|---|---|
| JP | 2012231074 A | 11/2012 |
| KR | 1020120082747 A | 7/2012 |
| KR | 101406172 B1 | 6/2014 |
| KR | 1020150011328 A | 1/2015 |
| TW | 200403136 A | 3/2004 |
| TW | 200745375 A | 12/2007 |

(Continued)

*Primary Examiner* — Moazzam Hossain
*Assistant Examiner* — Hajar Kolahdouzan
(74) *Attorney, Agent, or Firm* — William Park & Associates Ltd.

(57) ABSTRACT

Provided is a substrate processing apparatus and substrate processing method for depositing a thin film on a substrate. The substrate processing apparatus may include a chamber, a susceptor rotatably mounted in the chamber, at least one satellite mounted on the susceptor, configured to place a substrate thereon, and capable of being floated and rotating due to pressure of a gas supplied through the susceptor, to rotate the substrate, and of revolving due to rotation of the susceptor, and a cart lifting module including a cart mounted on the susceptor around the satellite and supporting an edge of the substrate to take over the substrate and place the substrate on the satellite, and a cart lifting device capable of lifting and lowering the cart.

7 Claims, 7 Drawing Sheets

(56) References Cited

FOREIGN PATENT DOCUMENTS

| | | |
|---|---|---|
| TW | 201230244 A | 7/2012 |
| TW | 201508859 A | 3/2015 |

\* cited by examiner

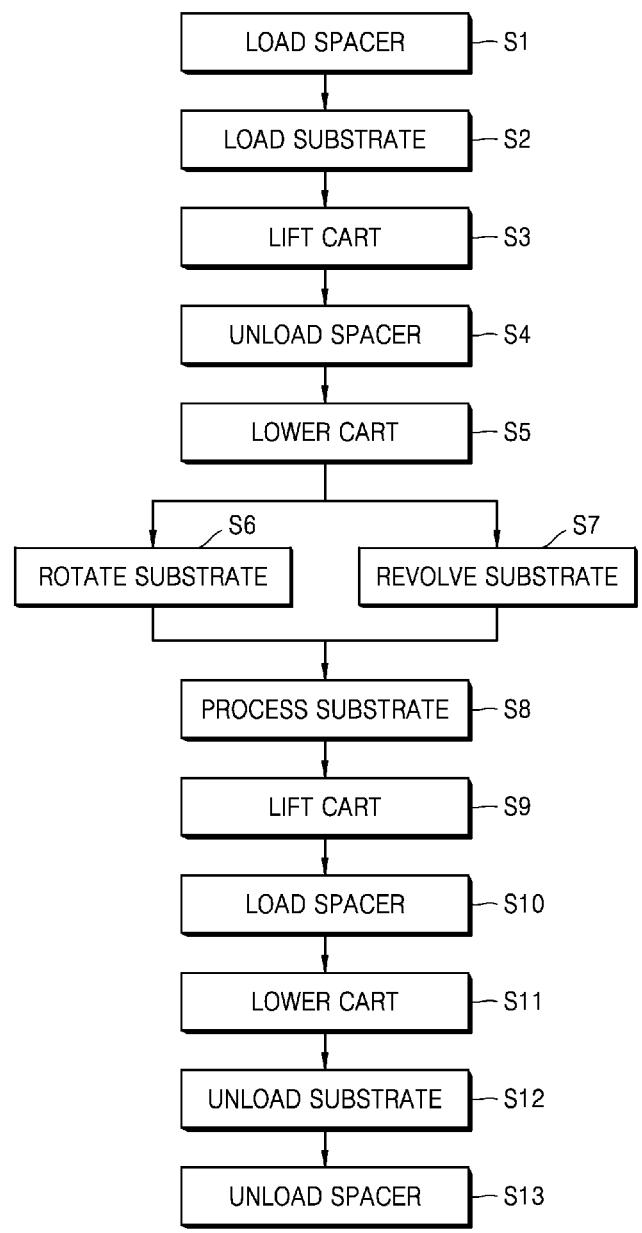

SUBSTRATE PROCESSING APPARATUS AND SUBSTRATE PROCESSING METHOD

CROSS-REFERENCE TO RELATED PATENT APPLICATION

This application claims the benefit of Korean Patent Application No. 10-2016-0135343, filed on Oct. 18, 2016, in the Korean Intellectual Property Office, the disclosure of which is incorporated herein in its entirety by reference.

BACKGROUND

1. Field

The present invention relates to a substrate processing apparatus and substrate processing method and, more particularly, to a substrate processing apparatus and substrate processing method for depositing a thin film on a substrate.

2. Description of the Related Technology

In general, a thin film deposition method used for a semiconductor includes a chemical vapor deposition (CVD) method and a physical vapor deposition (PVD) method. The CVD method refers to a technology of depositing a product generated due to chemical reaction between a gas-phase mixture and a heated substrate surface, on the substrate surface. The CVD method is divided into atmospheric CVD (APCVD), low pressure CVD (LPCVD), plasma enhanced CVD (PECVD), metal organic CVD (MOCVD), etc. based on the type of a material used as a precursor, pressure during a process, a method of transferring energy required for reaction, or the like.

Particularly, the MOCVD method is broadly used to grow single crystals of a nitride semiconductor for a light-emitting diode. The MOCVD method is a method of evaporating a liquid-phase organic metal compound to a gas phase and supplying the evaporated source gas to a high-temperature substrate to deposit a thin metal film on the substrate.

A thin film deposition apparatus using the MOCVD method is proposed to process a plurality of substrates all at once in a chamber to increase productivity. In this case, a susceptor provided in the chamber is configured to place the substrates thereon in a circumferential direction around the center thereof. To uniformly deposit a thin film on top surfaces of the substrates, satellites rotate to individually rotate the substrates and the susceptor also rotates. That is, the substrates revolve and rotate and thus a thin film is uniformly deposited on the top surfaces thereof.

The substrates to be processed are loaded onto the susceptor, and the completely processed substrates are unloaded from the susceptor. To automate a substrate loading and unloading operation using a transfer robot, the substrates should be lifted when the substrates are loaded and unloaded. However, since the susceptor and the satellites rotate as described above, tools such as lift pins for lifting the substrates may not be easily used at parts where the substrates are placed. Therefore, in general, the substrates are manually loaded and unloaded by a worker. As such, an experienced worker is required and efficiency of operation is low due to manual operation.

SUMMARY

The present invention provides a substrate processing apparatus and substrate processing method capable of automating a substrate loading and unloading operation, achieving equipment optimization by mounting a cart in a chamber, and thus greatly improving efficiency of operation. However, the scope of the present invention is not limited thereto.

According to an aspect of the present invention, there is provided a substrate processing apparatus including a chamber, a susceptor mounted in the chamber, the susceptor being rotatable, at least one satellite that is mounted on the susceptor and on which a substrate is placed, the at least one satellite being capable of being floated and rotating due to pressure of a gas supplied through the susceptor, to rotate the substrate, and of revolving due to rotation of the susceptor, and a cart lifting module including a cart mounted on the susceptor around the satellite to support an edge of the substrate, and a cart lifting device capable of lifting and lowering the cart, wherein the cart is lifted and lowered by the cart lifting device to hand over the substrate from the spacer for temporarily holding the substrate above the satellite, onto the satellite, or from the satellite onto the spacer.

The substrate may be a wafer for a semiconductor device, and the cart may have a ring shape including an accommodation recess for supporting an edge of the wafer, and a through window corresponding to a top surface of the satellite.

The cart lifting device may include a plurality of lift pins mounted on a bottom surface of the cart, a pin plate provided under the lift pins to support the lift pins, and a lift pin lifting device for lifting and lowering the pin plate.

The susceptor may have a circular table shape, and the at least one satellite may include a plurality of satellites provided on the susceptor in a circumferential direction around a center of the susceptor.

A height of a top surface of the satellite may be higher than a height of a substrate supporting surface of the completely lowered cart.

According to another aspect of the present invention, there is provided a substrate processing system including a chamber, a susceptor mounted in the chamber, the susceptor being rotatable, at least one satellite that is mounted on the susceptor and on which a substrate is placed, the at least one satellite being capable of being floated and rotating due to pressure of a gas supplied through the susceptor, to rotate the substrate, and of revolving due to rotation of the susceptor, a spacer located on the satellite to temporarily hold the substrate while the substrate is being handed or taken over onto or from the satellite, and a cart lifting module including a cart mounted on the susceptor around the satellite to support an edge of the substrate, and a cart lifting device capable of lifting and lowering the cart, wherein the cart is lifted and lowered by the cart lifting device to hand over the substrate from the spacer onto the satellite, or from the satellite onto the spacer.

The substrate processing system may further include a first transfer chamber connected to the chamber and configured to mount a spacer transfer robot therein to transfer the spacer onto the satellite.

The substrate processing system may further include a second transfer chamber connected to the chamber and configured to mount a substrate transfer robot therein to transfer the substrate onto the spacer placed on the satellite.

The spacer transfer robot and the substrate transfer robot may be transfer arms mounted on the same rotary shaft, and the first transfer chamber and the second transfer chamber may be integrated into an integrated transfer chamber.

The spacer may be stored on the spacer transfer robot in the integrated transfer chamber.

According to another aspect of the present invention, there is provided a substrate processing method using the above-described substrate processing system, the method including the steps of: a spacer loading step, for loading the spacer on the satellite of the chamber, a substrate loading step, for loading the substrate on the spacer, a cart lifting step, for lifting the cart to take over the substrate from the spacer, a spacer unloading step, for unloading the spacer from the satellite, and a cart lowering step, for lowering the cart to place the taken substrate on the satellite.

In the spacer loading step, the spacer may be lifted up, transferred, and then put down on the satellite using the spacer transfer robot mounted in the transfer chamber.

In the substrate loading step, the substrate larger than the spacer may be lifted up, transferred to locate the spacer to correspond to a center part of the substrate, and then put down on the spacer using the substrate transfer robot mounted in the transfer chamber.

In the cart lifting step, the substrate may be separated and lifted from the spacer using the cart capable of holding the edge of the substrate.

In the spacer unloading step, the spacer may be lifted up from the satellite and transferred to the transfer chamber using the spacer transfer robot mounted in the transfer chamber.

The substrate processing method may further include a substrate rotating step, for rotating the substrate by rotating the satellite, and a substrate revolving step, for revolving the substrate by rotating the susceptor to rotate the satellite along a circular orbit.

The substrate processing method may further include a cart lifting step, for lifting the cart supporting the substrate, to separate the substrate placed on the satellite, from the satellite, a spacer loading step, for transferring the spacer to between the satellite and the substrate and loading the spacer on the satellite, a cart lowering step, for lowering the cart to place the substrate on the spacer, a substrate unloading step, for taking over the substrate from the spacer and transferring the substrate to the transfer chamber, and a spacer unloading step, for unloading the spacer from the satellite to the transfer chamber.

BRIEF DESCRIPTION OF THE DRAWINGS

The above and other features and advantages of the present invention will become more apparent by describing in detail embodiments thereof with reference to the attached drawings in which:

FIG. 13 is a flowchart of a substrate processing method according to other embodiments of the present invention.

DETAILED DESCRIPTION

Figure 1:
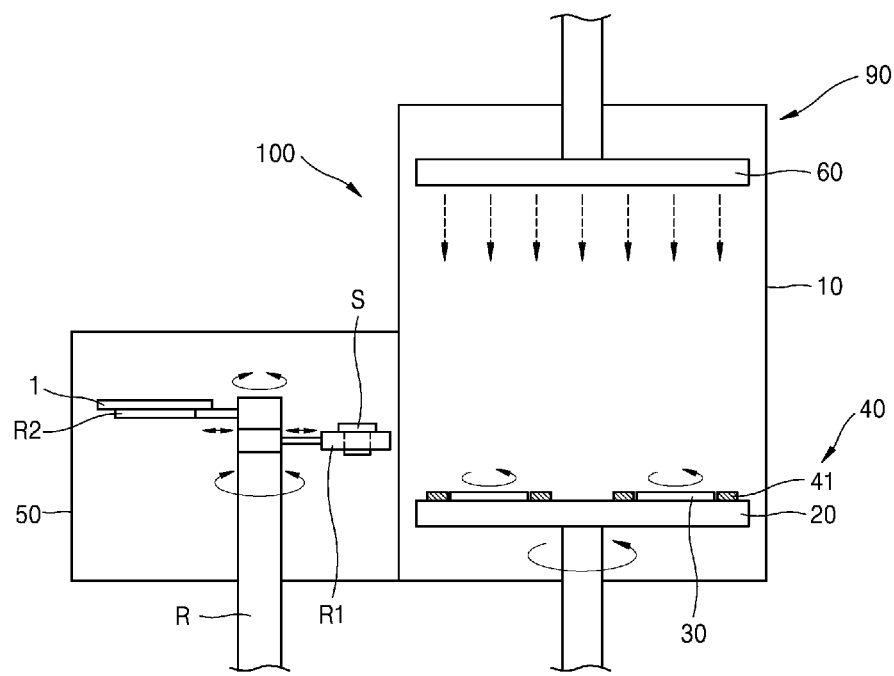
FIG. 1 is a conceptual view of a substrate processing apparatus and a substrate processing system according to some embodiments of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or size of layers are exaggerated for clarity.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

In this specification, a substrate processing apparatus may refer to a chamber for processing a substrate, and appurtenances thereof, and may also be called a process chamber or a process apparatus. A substrate processing system may refer to a system, e.g., a cluster system, including the substrate processing apparatus. For example, the substrate processing system may further include a transfer chamber connected to the substrate processing apparatus, and appurtenances thereof. In addition, the substrate processing system may further include one or more other chambers and appurtenances thereof, e.g., a load lock chamber and appurtenances thereof or a substrate alignment chamber and appurtenances thereof.

Figure 2:
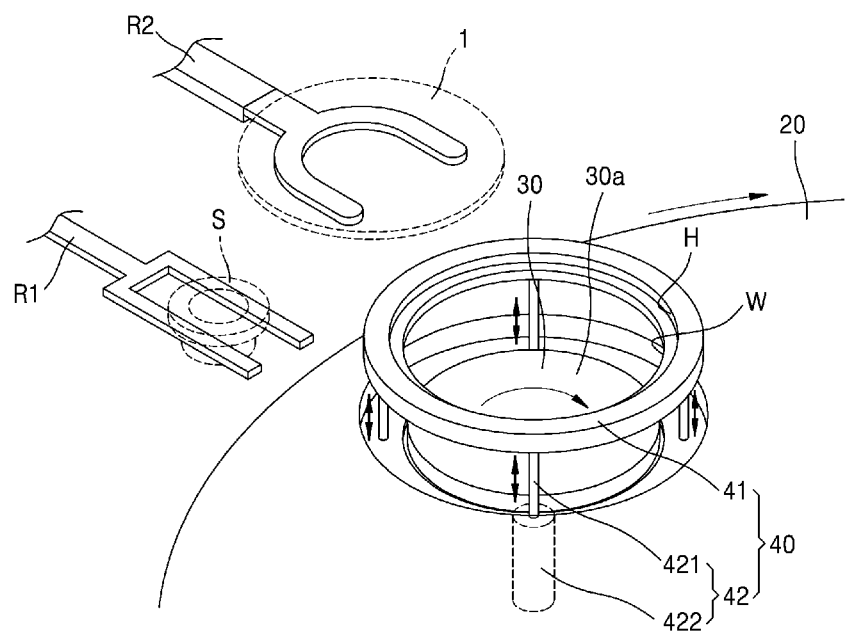
FIG. 2 is a perspective view of a part of the substrate processing apparatus and the substrate processing system of FIG. 1.
Figure 3:
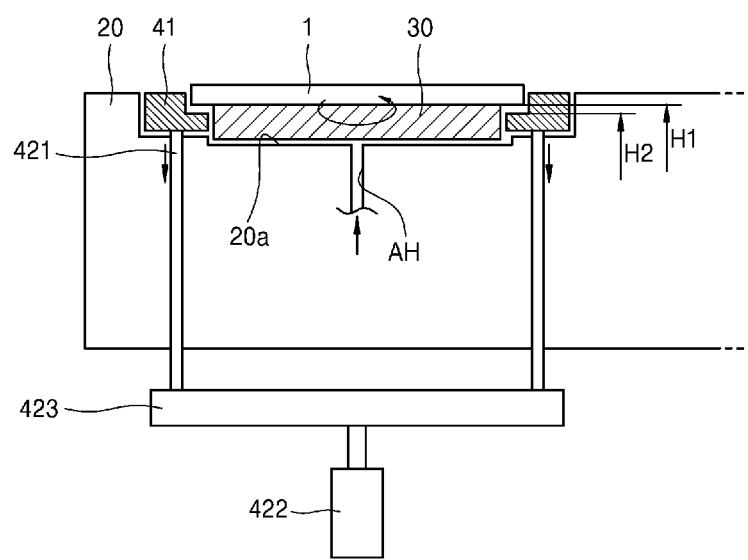
FIG. 3 is a cross-sectional view of a satellite of the substrate processing apparatus and the substrate processing system of FIG. 1.
Figure 4:
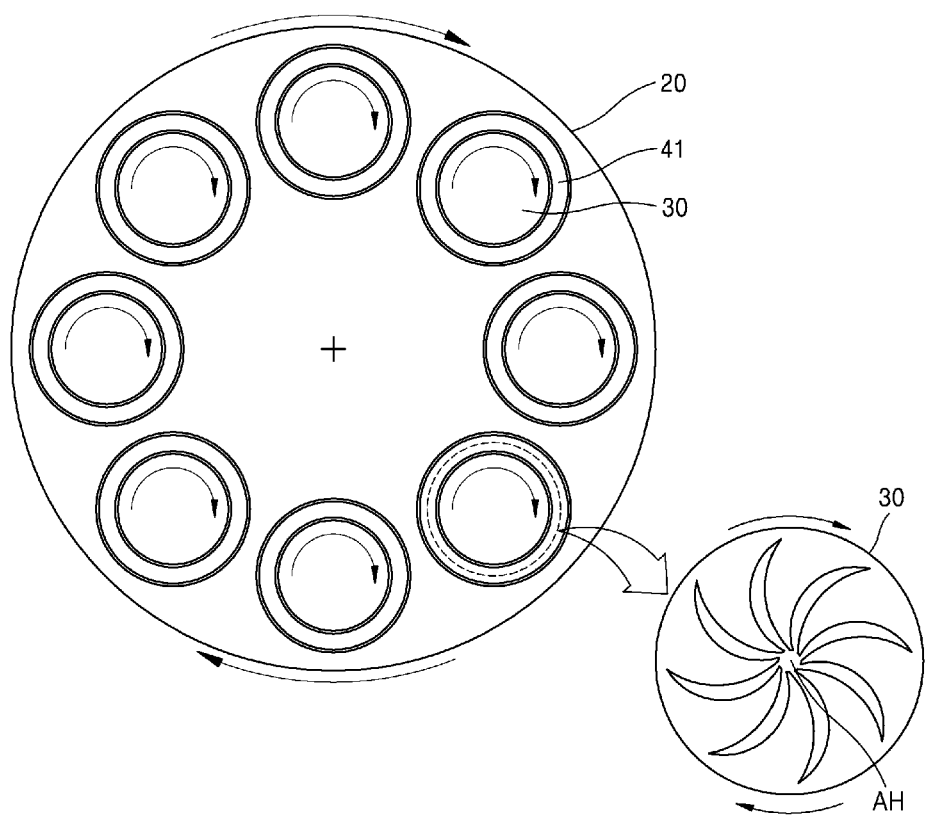
FIG. 4 is a plan view of a susceptor of the substrate processing apparatus and the substrate processing system of FIG. 1.

FIG. 1 is a conceptual view of a substrate processing apparatus 90 and a substrate processing system 100 according to some embodiments of the present invention. FIG. 2 is a perspective view of a part of the substrate processing apparatus 90 and the substrate processing system 100 of FIG. 1. FIG. 3 is a cross-sectional view of a satellite 30 of the substrate processing apparatus 90 and the substrate processing system 100 of FIG. 1. FIG. 4 is a plan view of a susceptor 20 of the substrate processing apparatus 90 and the substrate processing system 100 of FIG. 1.

As illustrated in FIGS. 1 to 4, the substrate processing apparatus 90 according to some embodiments of the present invention may include a chamber 10, the susceptor 20, the satellites 30, cart lifting modules 40, and a processing device 60.

Here, for example, the substrate processing apparatus 90 may be an apparatus capable of processing a plurality of substrates 1 in the chamber 10. For example, the substrate processing apparatus 90 may be a thin film deposition apparatus capable of depositing a thin film on the substrates 1 using metal organic chemical vapor deposition (MOCVD). However, the substrate processing apparatus 90 is not limited thereto and may include substrate processing apparatuses capable of performing a variety of processes on the substrates 10.

For example, as illustrated in FIGS. 1 to 4, the chamber 10 may have an internal space where a variety of processes such as a deposition process are performable. A gate through which the substrates 1 to be processed or end effectors of various robots enter may be provided at a side of the chamber 10, and the chamber 10 may include the processing device 60 for processing the substrates 1, e.g., a gas supplier for supplying a process gas such as a source gas or a reaction gas into the internal space. For example, the processing device 60 may have a shower head structure for uniformly spraying a gas on the substrates 1.

Here, the substrates 1 may be wafers for semiconductor devices.

For example, the susceptor 20 may be mounted in the chamber 10 and may be a large turntable-shaped structure capable of rotating to revolve the substrates 1.

For example, the satellites 30 may be mounted on the susceptor 20. The satellites 30 having placed the substrates 1 thereon may be floated and rotate due to pressure of a gas supplied through the susceptor 20, to rotate the substrates 1, and may revolve due to rotation of the susceptor 20. One or more, e.g., a plurality of, satellites 30 may be mounted on, for example, the susceptor 20 at equal intervals.

Specifically, the satellites 30 may be a plurality of small turntable-shaped structures capable of being floated and rotating due to pressure of a gas, e.g., an inert gas, discharged through gas holes AH in vortex shapes along vortex-shaped grooves provided on satellite-facing surfaces 20a, to rotate the substrates 1. Accordingly, using the gas-floated satellites 30, the structure of the susceptor 20 may be very simplified and friction with the substrates 1 or other parts may be minimized.

When the gas-floated satellites 30 are used, if the substrates 1 are handed over using lift pins which pass through the satellites 30, pressure of the gas for rotating the satellites 30 is leaked and thus a problem occurs in rotation of the satellites 30. According to an embodiment of the present invention, to solve the above problem, the substrates 1 may be lifted and lowered using carts 41 mounted around the satellites 30 not to interfere with the satellites 30.

Additionally, to efficiently hand or take over each substrate 1 onto or from the cart 41, a spacer S capable of temporarily holding the substrate 1 may be provided on a vertical path of the cart 41. For example, the spacer S may be temporarily held by the satellite 30, the substrate 1 may be held by the spacer S, and then the cart 41 may be lifted to hand over the substrate 1 from the spacer S onto the cart 41. To this end, the spacer S should be provided flat in the satellite 30 not to collide with the cart 41 and may have a smaller flat area than, for example, the substrate 1.

Specifically, for example, as illustrated in FIGS. 2 and 3, the satellite 30 includes a spacer accommodation surface 30a on a top surface thereof. To support and rotate the substrate 1, as illustrated in FIG. 3, a height H1 of the top surface of the satellite 30 may be higher than a height H2 of a substrate supporting surface of the completely lowered cart 41.

As illustrated in FIG. 4, the susceptor 20 may have a circular table shape, and a plurality of satellites 30 may be provided on the susceptor 20 in a circumferential direction around the center of the susceptor 20. For example, a plurality of satellites 30 may be provided on the susceptor 20 at equal angles around the center of rotation of the susceptor 20.

The susceptor 20 and the satellites 30 have the above-described shapes to process a larger number of the substrates 1 all at once for mass production.

Accordingly, the substrates 1 may rotate by the satellites 30 while revolving around the center of rotation of the susceptor 20 by the susceptor 20, and thus a uniform thin film may be deposited on the plurality of substrates 1.

For example, as illustrated in FIGS. 1 to 4, each cart lifting module 40 may include the cart 41 mounted on the susceptor 20 around the satellite 30 and supporting the edge of the substrate 1 to take over the substrate 1 and place the substrate 1 on the satellite 30, and a cart lifting device 42 capable of lifting and lowering the substrate 1 by lifting and lowering the cart 41. The cart 41 may be lifted and lowered by the cart lifting device 42 to hand over the substrate 1 from the spacer S for temporarily holding the substrate 1 above the satellite 30, onto the satellite 30, or from the satellite 30 onto the spacer S.

Specifically, for example, as illustrated in FIGS. 2 and 3, the cart 41 may have a circular ring shape including an accommodation recess H for supporting the edge of the substrate 1", and a through window W corresponding to the top surface of the satellite 30.

Herein, more specifically, for example, the cart 41 may be configured to cover a part of a top surface of the susceptor 20 when lowered, and to support the edge of the substrate 1 when lifted. The cart 41 may perform a variety of roles and functions. For example, the cart 41 may guide a vertical path and a rotation path of the substrate 1, control heat transferred from the susceptor 20 to reduce thermal shock applicable to the substrate 1, equalize preheating, and help in forming an electromagnetic field.

To this end, the cart 41 may be produced partially or entirely using a variety of materials such as ceramic, metal, quartz, graphite, and silicon carbide.

Specifically, for example, as illustrated in FIGS. 2 and 3, the cart lifting device 42 may include lift pins 421 mounted on a bottom surface of the cart 41, and lift pin lifting devices 422 for lifting and lowering the lift pins 421, e.g., motors or cylinders.

Here, one or more, e.g., three or four, lift pins 421 may be mounted on the bottom surface of the cart 41 to distribute load. In addition, for example, to block heat transferred from the susceptor 20, the lift pins 421 may be produced partially or entirely using a variety of materials such as ceramic, metal, quartz, graphite, and silicon carbide.

For example, a pin plate 423 may be provided under the lift pins 421 to support the lift pins 421. In this case, one lift pin lifting device 422 may simultaneously lift and lower the lift pins 421 by lifting and lowering the pin plate 423. Accordingly, the lift pin lifting devices 422 are not limited to the illustrated forms, and a large variety of lifting devices connected to various-types of connection pins are usable.

For example, as illustrated in FIG. 1, the substrate processing system 100 according to some embodiments of the present invention is produced by systematizing the above-described substrate processing apparatus 90, and may include the substrate processing apparatus 90 and the spacer S. The substrate processing system 100 may further include a first transfer chamber connected to the chamber 10 and having mounted therein a spacer transfer robot R1 for transferring the spacer S to hand over the substrate 1 from the satellite 30 onto the cart 41, or a second transfer chamber connected to the chamber 10 and having mounted therein a substrate transfer robot R2 for transferring the substrate 1 onto the spacer S placed on the satellite 30.

Specifically, for example, as illustrated in FIG. 1, the spacer transfer robot R1 and the substrate transfer robot R2 may be transfer arms mounted on the same rotary shaft R, and the first transfer chamber and the second transfer chamber may be integrated into an integrated transfer chamber 50. As such, an additional transfer chamber and rotary shaft for storing the spacer S may not be required and thus apparatus simplification may be achieved.

However, in a modified embodiment of the current embodiment, the first transfer chamber and the second transfer chamber may be separately provided and the spacer transfer robot R1 and the substrate transfer robot R2 may be mounted on separate rotary shafts.

In the current embodiment, the spacer S may be located on the satellite 30 to temporarily hold the substrate 1 while the substrate 1 is being handed or taken over onto or from the satellite 30. For example, the spacer S may have a variety of shapes having a substrate holding surface on which the substrate 1 is temporarily held, and have a variety of shapes having a robot-holdable surface to be carried by the spacer transfer robot R1.

For example, the spacer S may include a vertical frame provided in a vertical direction to temporarily support the substrate 1 at a certain height, and a horizontal frame extending in a horizontal direction so as to be lifted in contact with an arm of the spacer transfer robot R1. For example, the vertical frame may include at least one selected from among at least one leg, circular pipe, oval pipe, triangular pipe, rectangular pipe, polygonal pipe, cross-shaped frame, S-shaped frame, 8-shaped frame, and combinations thereof. The horizontal frame may have at least one through hole and may include at least one selected from among at least a circular ring frame, oval ring frame, triangular ring frame, rectangular ring frame, polygonal ring frame, cross-shaped frame, S-shaped frame, 8-shaped frame, and combinations thereof.

Accordingly, as illustrated in FIG. 1, the spacer S and the substrate 1 may be loaded in and unloaded from the chamber 10 using the spacer transfer robot R1 and the substrate transfer robot R2 mounted in the integrated transfer chamber 50.

FIGS. 5 to 11 are cross-sectional views for describing a substrate processing procedure using the substrate processing system 100 of FIG. 1.

Figure 5:
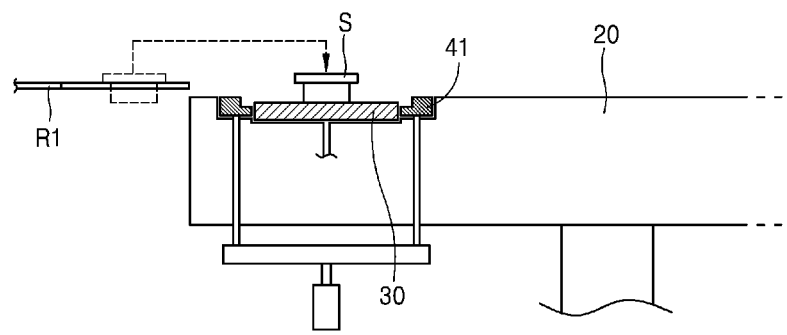
FIGS. 5 to 11 are cross-sectional views for describing a substrate processing procedure using the substrate processing apparatus and the substrate processing system of FIG. 1.

The substrate processing procedure using the above-described substrate processing system 100 will now be described with reference to FIGS. 1 to 11. Initially, as illustrated in FIG. 5, the spacer S may be loaded on the satellite 30 of the chamber 10.

Here, the spacer S may be lifted up from the integrated transfer chamber 50, transferred to the chamber 10, and then put down on the satellite 30 using the spacer transfer robot R1.

Figure 6:
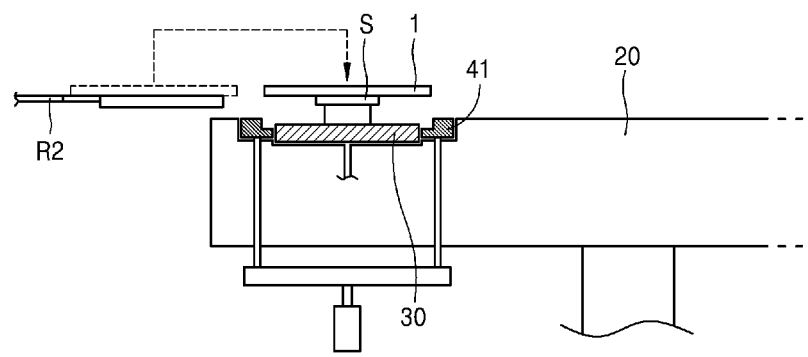

Then, as illustrated in FIG. 6, the substrate 1 may be loaded on the spacer S placed on the satellite 30.

Here, the substrate 1 larger than the spacer S may be lifted up from the integrated transfer chamber 50, transferred to the chamber 10 to locate the spacer S to correspond to a center part of the substrate 1, and then put down on the spacer S using the substrate transfer robot R2.

Figure 7:
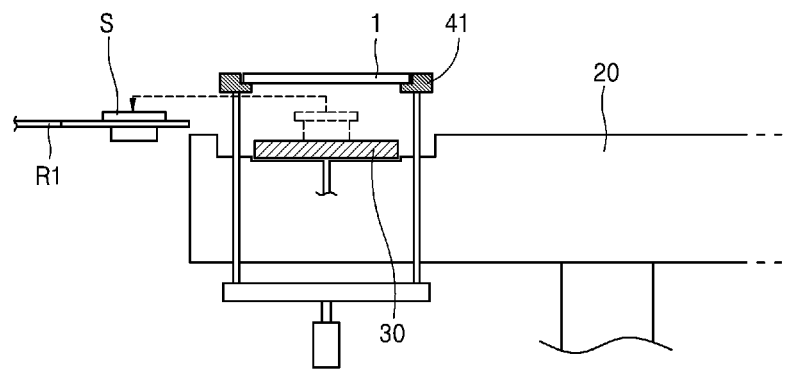

Subsequently, as illustrated in FIG. 7, the cart 41 may be lifted to take over the substrate 1 from the spacer S. In this case, the substrate 1 may be separated and lifted from the spacer S using the cart 41 capable of holding the edge of the substrate 1. Then, the spacer S may be unloaded from the satellite 30. In this case, the spacer S may be lifted up from the satellite 30 and transferred to the integrated transfer chamber 50 using the spacer transfer robot R1.

Figure 8:
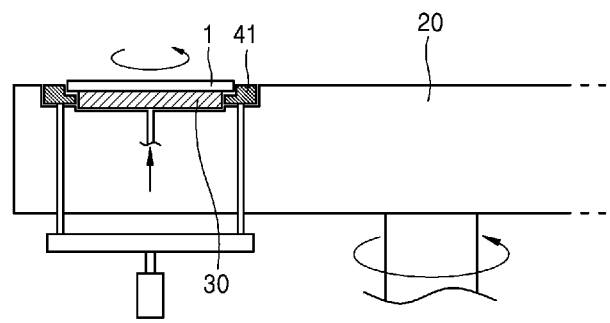

Thereafter, as illustrated in FIG. 8, the cart 41 may be lowered to place the taken substrate 1 on the satellite 30.

Here, as illustrated in FIG. 3, since the height H1 of the top surface of the satellite 30 is higher than the height H2 of the substrate supporting surface of the completely lowered cart 41, the satellite 30 may take over and rotate the substrate 1.

Then, the substrate 1 may rotate by rotating the satellite 30, and may revolve by rotating the susceptor 20 to rotate the satellite 30 along a circular orbit.

Here, after the substrate 1 is loaded in the chamber 10 as illustrated in FIGS. 5 to 8, although not shown in FIGS. 5 to 8, a variety of gases may be supplied to deposit a thin film on the rotating and revolving substrate 1 using the processing device 60 as described above.

Figure 9:
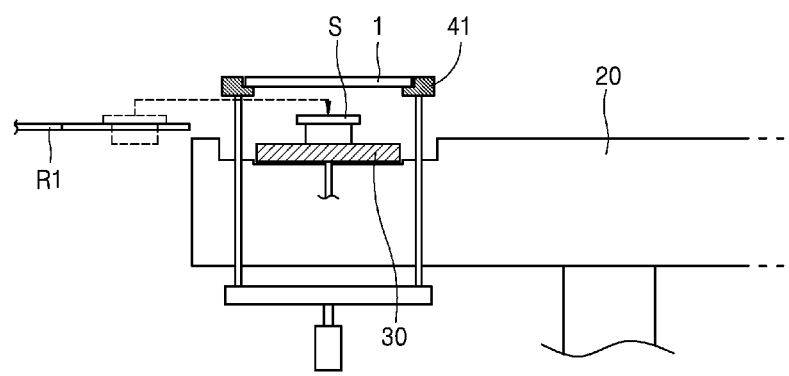
Figure 10:
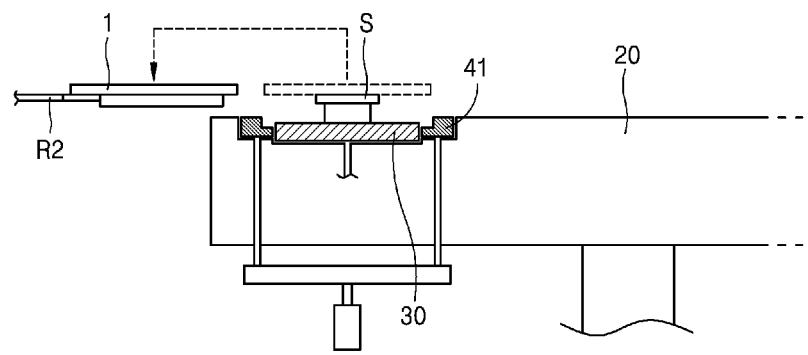
Figure 11:
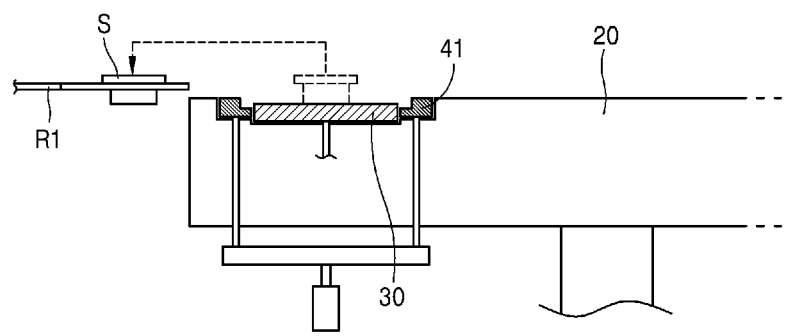

Subsequently, as illustrated in FIGS. 9 to 11, the completely processed substrate 1 may be unloaded from the chamber 10.

That is, as illustrated in FIG. 9, the cart 41 supporting the substrate 1 may be lifted to separate the substrate 1 placed on the satellite 30, from the satellite 30.

Then, the spacer S may be transferred to between the satellite 30 and the substrate 1 and loaded on the satellite 30.

Thereafter, as illustrated in FIG. 10, the cart 41 may be lowered to place the substrate 1 on the spacer S. Then, the substrate 1 may be taken over from the spacer S and unloaded to the integrated transfer chamber 50.

After that, as illustrated in FIG. 11, the spacer S may be unloaded from the satellite 30 to the integrated transfer chamber 50.

Therefore, as described above, a substrate loading and unloading operation may be automated using the spacer S, equipment optimization may be achieved by mounting the cart 41 in the chamber 10, the substrate 1 may be loaded and unloaded without an experienced worker, and thus efficiency of operation may be greatly improved.

Figure 12:
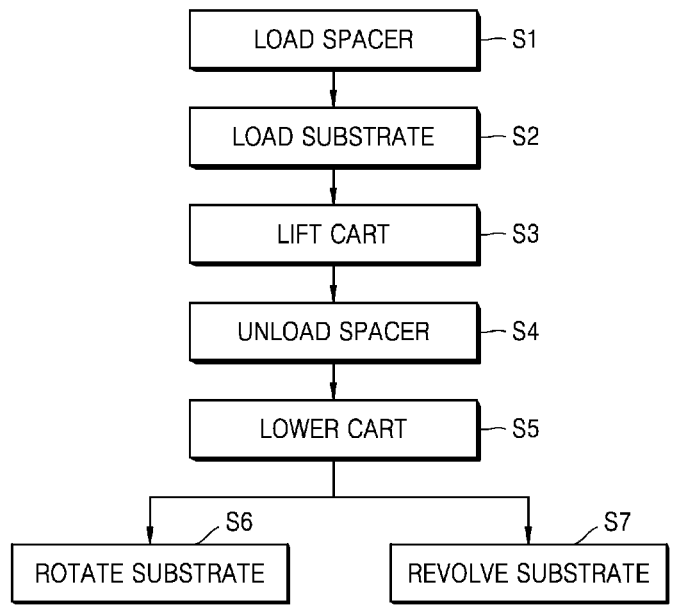
FIG. 12 is a flowchart of a substrate processing method according to some embodiments of the present invention.

FIG. 12 is a flowchart of a substrate processing method according to some embodiments of the present invention.

As illustrated in FIGS. 1 to 12, the substrate processing method according to some embodiments of the present invention may include the steps of: a spacer loading step S1 for loading the spacer S on the satellite 30 of the chamber 10, a substrate loading step S2 for loading the substrate 1 on the spacer S, a cart lifting step S3 for lifting the cart 41 to take over the substrate 1 from the spacer S, a spacer unloading step S4 for unloading the spacer S from the satellite 30, and a cart lowering step S5 for lowering the cart 41 to place the taken substrate 1 on the satellite 30.

For example, as illustrated in FIG. 5, in the spacer loading step S1, the spacer S may be lifted up, transferred, and then put down on the satellite 30 using the spacer transfer robot R1.

For example, as illustrated in FIG. 6, in the substrate loading step S2, the substrate 1 larger than the spacer S may be lifted up, transferred to locate the spacer S to correspond to a center part of the substrate 1, and then put down on the spacer S using the substrate transfer robot R2.

For example, in the cart lifting step S3, the substrate 1 may be separated and lifted from the spacer S using the cart 41 capable of holding the edge of the substrate 1.

For example, as illustrated in FIG. 7, in the spacer unloading step S4, the spacer S may be lifted up from the satellite 30 and transferred to the integrated transfer chamber 50 using the spacer transfer robot R1.

For example, as illustrated in FIG. 8, the substrate processing method according to some embodiments of the present invention may further include a substrate rotating step S6 for rotating the substrate 1 by rotating the satellite 30, and a substrate revolving step S7 for revolving the substrate 1 by rotating the susceptor 20 to rotate the satellite 30 along a circular orbit.

FIG. 13 is a flowchart of a substrate processing method according to other embodiments of the present invention.

As illustrated in FIGS. 1 to 13, the substrate processing method according to other embodiments of the present invention may include the steps of: a spacer loading step S1 for loading the spacer S on the satellite 30 of the chamber 10, a substrate loading step S2 for loading the substrate 1 on the spacer S, a cart lifting step S3 for lifting the cart 41 to take over the substrate 1 from the spacer S, a spacer unloading step S4 for unloading the spacer S from the satellite 30, a cart lowering step S5 for lowering the cart 41 to place the taken substrate 1 on the satellite 30, a substrate rotating step S6 for rotating the substrate 1 by rotating the satellite 30, a substrate revolving step S7 for revolving the substrate 1 by rotating the susceptor 20 to rotate the satellite 30 along a circular orbit, a substrate processing step S8 for depositing a thin film by supplying a gas while rotating and revolving the substrate 1, a cart lifting step S9 for lifting the cart 41 supporting the substrate 1, to separate the substrate 1 placed on the satellite 30, from the satellite 30, a spacer loading step S10 for transferring the spacer S to between the satellite 30 and the substrate 1 and loading the spacer S on the satellite 30, a cart lowering step S11 for lowering the cart 41 to place the substrate 1 on the spacer S, a substrate unloading step S12 for taking over the substrate 1 from the spacer S and transferring the substrate 1 to the integrated transfer chamber 50, and a spacer unloading step S13 for unloading the spacer S from the satellite 30 to the integrated transfer chamber 50.

Here, the substrate rotating step S6 and the substrate revolving step S7 may be performed in any order. For example, one of the two steps may be performed first or the two steps may be performed at the same time.

Therefore, as described above, a substrate loading and unloading operation may be automated using the spacer S, equipment optimization may be achieved by mounting the cart 41 in the chamber 10, the substrate 1 may be loaded and unloaded without an experienced worker, and thus efficiency of operation may be greatly improved.

According to the afore-described embodiments of the present invention, a substrate loading and unloading operation may be automated using a spacer, equipment optimization may be achieved by mounting a cart in a chamber, a substrate may be loaded and unloaded without an experienced worker, and thus efficiency of operation may be greatly improved. However, the scope of the present invention is not limited to the above effects.

While the present invention has been particularly shown and described with reference to embodiments thereof, it will be understood by one of ordinary skill in the art that various changes in form and details may be made therein without departing from the spirit and scope of the present invention as defined by the following claims.

What is claimed is:

1. A substrate processing apparatus comprising:
    a chamber;
    a rotatable susceptor located in the chamber;
    a satellite located on and removably supported by the susceptor, the satellite comprising:
        a first, substantially-planar top surface on which a semiconductor substrate can be placed and supported, the satellite additionally comprising a substantially-planar bottom surface;
    the rotatable susceptor comprising a satellite-facing surface, above which is located the substantially planar bottom surface of the satellite, the rotatable susceptor being additionally configured to receive a pressurized gas and to direct said pressured gas between the satellite-facing surface and the bottom surface of the satellite, the satellite being sized, shaped and arranged to be capable of being supported above the satellite-facing surface by said pressurized gas; and
    a cart lifting module comprising a cart, which is located on and removably supported by the rotatable susceptor, the cart lifting module additionally comprising a plurality of substantially vertical pins, the pins being sized, shaped and arranged to support and move vertically and thereby lift the cart above the satellite, the pins being located around and outside a peripheral edge of the satellite.

2. The apparatus of claim 1, wherein the cart is substantially ring-shaped and additionally comprises a recess formed into an inside surface of the substantially ring-shaped cart, the recess being configured to support an edge of a semiconductor wafer on the satellite.

3. The apparatus of claim 2, wherein the cart lifting device comprises:
    a plurality of lift pins mounted on a bottom surface of the cart;
    a pin plate provided under the lift pins to support the lift pins; and
    a lift pin lifting device for lifting and lowering the pin plate.

4. The apparatus of claim 1, wherein the susceptor is substantially circular; and wherein the at least one satellite comprises a plurality of satellites provided on the susceptor in a circumferential direction around a center of the susceptor.

5. The apparatus of claim 1, wherein the satellite-facing surface of the rotatable susceptor has its own surface which is configured to urge pressurized gas flowing between the satellite-facing surface and the bottom surface of the satellite to flow substantially circularly.

6. The substrate processing apparatus of claim 1, wherein the satellite-facing surface comprises a substantially vortex-shaped groove.

7. The substrate processing apparatus of claim 6, wherein the susceptor additionally comprises a hole, operatively coupled to the substantially vortex-shaped groove, the hole being configured to carry a pressurized gas to the substantially vortex-shaped groove.

* * * * *